US010516011B2

(12) United States Patent
Lee et al.

(10) Patent No.: US 10,516,011 B2
(45) Date of Patent: Dec. 24, 2019

(54) DISPLAY DEVICE WITH A PLURALITY OF INSULATING LAYERS BETWEEN TWO ELECTRODES AND METHOD OF MANUFACTURING THE SAME

(71) Applicant: LG Display Co., Ltd., Seoul (KR)

(72) Inventors: Joon-Suk Lee, Seoul (KR); Se-June Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 9 days.

(21) Appl. No.: 15/825,424

(22) Filed: Nov. 29, 2017

(65) Prior Publication Data

US 2018/0151647 A1 May 31, 2018

(30) Foreign Application Priority Data

Nov. 30, 2016 (KR) ........................ 10-2016-0161609

(51) Int. Cl.
*H01L 27/32* (2006.01)
*H01L 21/02* (2006.01)

(52) U.S. Cl.
CPC .... *H01L 27/3246* (2013.01); *H01L 21/02008* (2013.01); *H01L 21/02104* (2013.01); *H01L 27/3244* (2013.01)

(58) Field of Classification Search
CPC ................................................ H01L 27/3246; H01L 27/124; H01L 27/3244
See application file for complete search history.

(56) References Cited

U.S. PATENT DOCUMENTS 5,969,425 A 10/1999 Chen et al.
6,040,589 A 3/2000 Zhang et al.
(Continued)

FOREIGN PATENT DOCUMENTS

CN 105742324 A 7/2016
JP H11-214326 A 8/1999
(Continued)

OTHER PUBLICATIONS

Japanese Office Action dated Oct. 25, 2018, issued by the Japanese Patent Office for counterpart Japanese Patent Application No. 2017-229779.
(Continued)

*Primary Examiner* — Douglas M Menz
(74) *Attorney, Agent, or Firm* — Morgan, Lewis & Bockius LLP

(57) ABSTRACT

Provided are a display device and a method of manufacturing the same. A display device includes: a lower substrate, a first over-coat layer on the lower substrate, the first over-coat layer including a first contact hole, a thin film transistor between the lower substrate and the first over-coat layer, the thin film transistor including a drain electrode including an end portion overlapping the first contact hole, the end portion of the drain electrode including an under-cut region, a lower passivation layer between the thin film transistor and the first over-coat layer, the lower passivation layer partially exposing a side surface of the end portion of the drain electrode, and a light-emitting structure on the first over-coat layer, the light-emitting structure being electrically connected to the thin film transistor through the first contact hole.

12 Claims, 14 Drawing Sheets

(56) References Cited

U.S. PATENT DOCUMENTS

| | | |
|---|---|---|
| 6,159,851 A | 12/2000 | Chen et al. |
| 2004/0183955 A1 | 9/2004 | Souk et al. |
| 2005/0012454 A1 | 1/2005 | Yamazaki et al. |
| 2006/0281317 A1 | 12/2006 | Misaki |
| 2009/0286445 A1 | 11/2009 | Yamazaki et al. |
| 2011/0220889 A1* | 9/2011 | Kurokawa ............ G02F 1/1362 |
| | | 257/43 |
| 2012/0086881 A1 | 4/2012 | Kim et al. |
| 2013/0208205 A1 | 8/2013 | Misaki |
| 2014/0253850 A1 | 9/2014 | Lee et al. |
| 2014/0312323 A1 | 10/2014 | Park et al. |
| 2016/0020422 A1 | 1/2016 | Kim et al. |
| 2016/0190225 A1 | 6/2016 | Kim et al. |

FOREIGN PATENT DOCUMENTS

| | | |
|---|---|---|
| JP | 2001-516153 A | 9/2001 |
| JP | 2005-141213 A | 6/2005 |
| JP | 2006-332209 A | 12/2006 |
| JP | 2015-015475 A | 1/2015 |

OTHER PUBLICATIONS

Taiwanese Office Action dated Oct. 25, 2018, issued by the Taiwanese Patent Office for counterpart Taiwanese Patent Application No. 106141673.

Extended European Search Report dated Apr. 26, 2018, issued by the European Patent Office for counterpart European Patent Application No. 17204336.6.

* cited by examiner

DISPLAY DEVICE WITH A PLURALITY OF INSULATING LAYERS BETWEEN TWO ELECTRODES AND METHOD OF MANUFACTURING THE SAME

CROSS-REFERENCE TO RELATED APPLICATION(S)

This application claims the priority of Korean Application No. 10-2016-0161609, filed on Nov. 30, 2016, the entirety of which is hereby incorporated by reference.

BACKGROUND

1. Technical Field

The present disclosure relates to a display device with a plurality of insulating layers between two electrodes and a method of manufacturing the same.

2. Discussion of the Related Art

Generally, an electronic appliance, such as a monitor, a TV, a laptop computer, and a digital camera, may include a display device to realize an image. For example, the display device may include a liquid crystal display device and an organic light-emitting display device.

The display device may include a plurality of pixel areas. Each of the pixel areas may display a color different from adjacent pixel area. For example, the display device may include a blue pixel area realizing a blue color, a red pixel area realizing a red color, a green pixel area realizing a green color, and a white pixel area realizing a white color.

The display device may include various signal lines and thin film transistors for independently driving each pixel area. In the display device, the signal lines and the thin film transistors may be stacked for improving the integration of each pixel area. For example, in the display device, two electrodes disposed in different layers may be connected through a contact hole that penetrates a plurality of insulating layers.

However, in the display device, an area of the contact hole disposed at an upper insulating layer may be larger than an area of the contact hole disposed at a lower insulating layer under the upper insulating layer. Thus, in the display device, the pixels per inch (PPI) or pixel density may be degraded by the area of the contact hole penetrating the stacked insulating layers.

SUMMARY

Accordingly, the present disclosure is directed to a display device with a plurality of insulating layers between two electrodes and method of manufacturing the same that substantially obviate one or more of the issues due to limitations and disadvantages of the related art.

An aspect of the present disclosure is to provide a display device in which a contact hole penetrates a plurality of insulating layers for electrically connecting two electrodes disposed on different layers.

Another aspect of the present disclosure is to provide a display device having a thin film transistor and signal lines stacked without decreasing the pixel density, e.g., number of pixels per inch.

Another aspect of the present disclosure is to provide a display device with a reduced area of a contact hole for two electrodes disposed in different layers.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display device, including: a lower substrate, a first over-coat layer on the lower substrate, the first over-coat layer including a first contact hole, a thin film transistor between the lower substrate and the first over-coat layer, the thin film transistor including a drain electrode including an end portion overlapping the first contact hole, the end portion of the drain electrode including an under-cut region, a lower passivation layer between the thin film transistor and the first over-coat layer, the lower passivation layer partially exposing a side surface of the end portion of the drain electrode, and a light-emitting structure on the first over-coat layer, the light-emitting structure being electrically connected to the thin film transistor through the first contact hole.

In another aspect, there is provided a display device, including: a lower substrate, an auxiliary electrode on the lower substrate, a lower passivation layer on the auxiliary electrode, the lower passivation layer including a lower contact hole exposing the auxiliary electrode, and a bank insulating layer on the lower passivation layer, the bank insulating layer including a bank contact hole overlapping the auxiliary electrode, the bank contact hole including a side surface on the inside of the lower contact hole, wherein a plane shape of the side surface of the bank contact hole is a concave-convex shape.

In another aspect, there is provided a method of manufacturing a display device, the method including: providing a lower substrate, providing a first over-coat layer on the lower substrate, the providing the first over-coat layer including providing a first contact hole, providing a thin film transistor between the lower substrate and the first over-coat layer, the providing the thin film transistor including providing a drain electrode including an end portion overlapping the first contact hole, the end portion of the drain electrode including an under-cut region, providing a lower passivation layer between the thin film transistor and the first over-coat layer, the lower passivation layer partially exposing a side surface of the end portion of the drain electrode, and providing a light-emitting structure on the first over-coat layer, the light-emitting structure being electrically connected to the thin film transistor through the first contact hole.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that are included to provide a further understanding of the disclosure and are incorporated in and constitute a part of this application, illustrate embodiments of the disclosure and together with the description serve to explain various principles of the disclosure.

Figure 1:
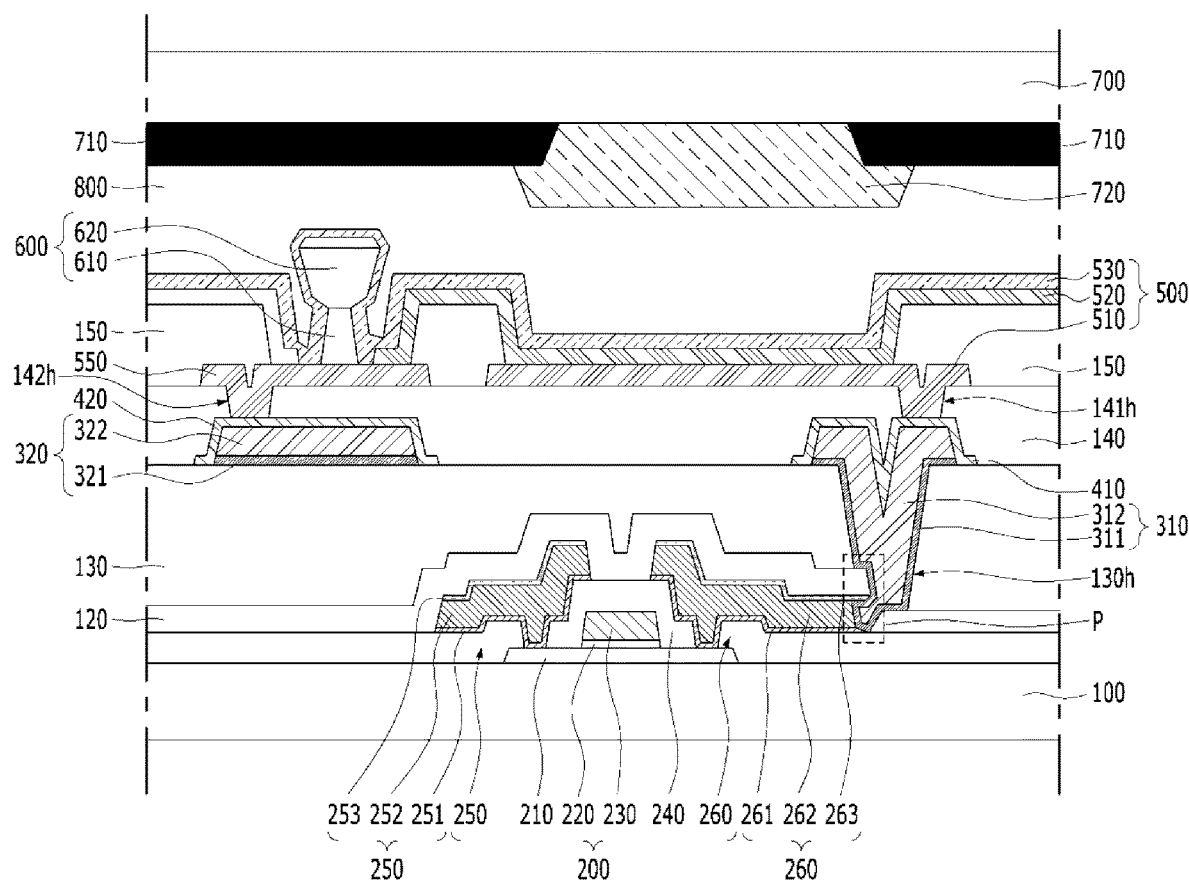
FIG. 1 is a view showing a display device according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of that may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Figure 2:
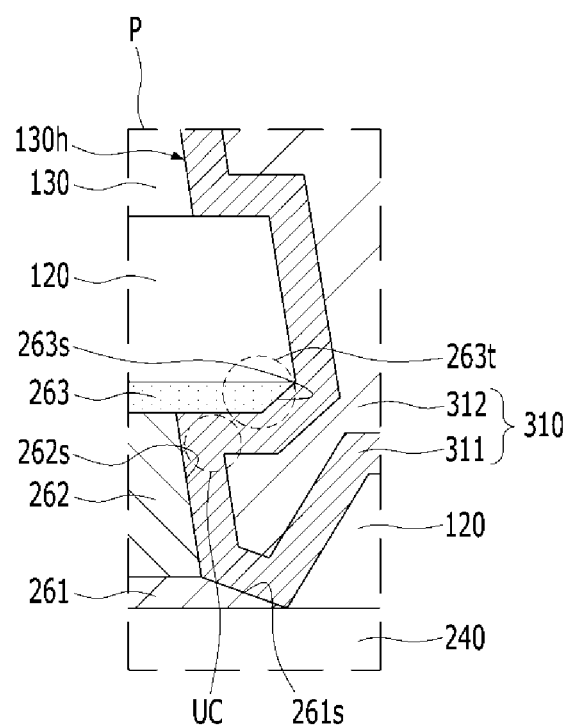
FIG. 2 is an enlarged view of a region P in FIG. 1.
Figure 3:
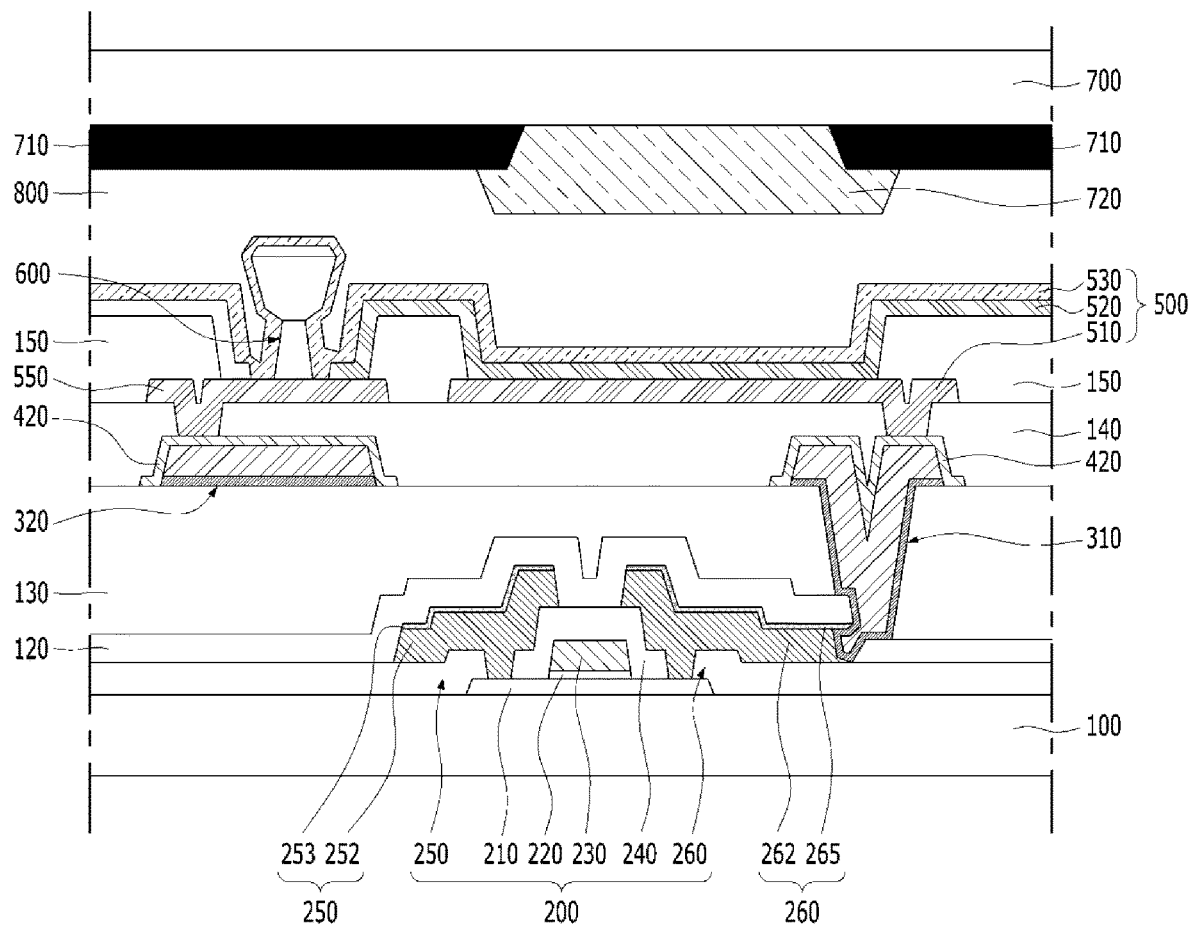
FIGS. 3 and 4 are views respectively showing a display device according to another example embodiment of the present disclosure.
Figure 4:
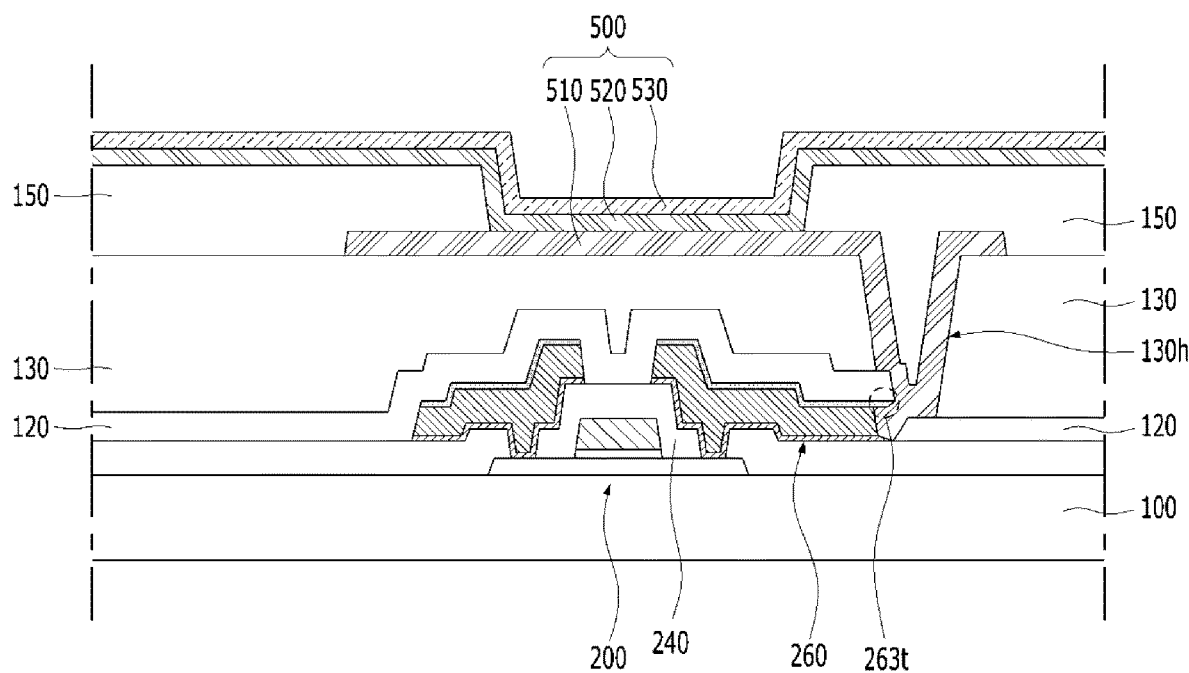

FIG. 1 is a view showing a display device according to an example embodiment of the present disclosure. FIG. 2 is an enlarged view of a region P in FIG. 1. FIGS. 3 and 4 are views respectively showing a display device according to another example embodiment of the present disclosure.

With reference to FIGS. 1 and 2, a display device according to an example embodiment of the present disclosure may include a lower substrate 100, thin film transistor 200, a lower passivation layer 120, a lower over-coat layer 130, a connection electrode 310, an upper over-coat layer 140, and a light-emitting structure 500. For example, a display device according to an example embodiment of the present disclosure may be a self-luminous display device.

The lower substrate 100 may support the thin film transistor 200 and the light-emitting structure 500. The lower substrate 100 may include an insulating material. The lower substrate 100 may include a transparent material. For example, the lower substrate 100 may include glass or plastic.

The thin film transistor 200 may be disposed on the lower substrate 100. For example, the thin film transistor 200 may include a semiconductor pattern 210, a gate insulating layer 220, a gate electrode 230, an interlayer insulating layer 240, a source electrode 250, and a drain electrode 260.

The semiconductor pattern 210 may be disposed close to the lower substrate 100. The semiconductor pattern 210 may include a semiconductor material. For example, the semiconductor pattern 210 may include amorphous silicon or poly-silicon. The semiconductor pattern 210 may include an oxide semiconductor material. For example, the semiconductor pattern may include indium gallium zinc oxide (IGZO).

The semiconductor pattern 210 may include a source region, a drain region, and a channel region. The channel region may be disposed between the source region and the drain region. The conductivity of the channel region may be lower than the conductivities of the source region and the drain region. For example, the source region and the drain region may include a conductive impurity.

The semiconductor pattern 210 of the thin film transistor 200 may be in direct contact with the lower substrate 100. In another example, a buffer layer may be between the lower substrate 100 and the thin film transistor 200. The buffer layer may include an insulating material. For example, the buffer layer may include silicon oxide.

The gate insulating layer 220 may be disposed on the semiconductor pattern 210. The gate insulating layer 220 may include an insulating material. For example, the gate insulating layer 220 may include silicon oxide and/or silicon nitride. The gate insulating layer 220 may include a high-K material. For example, the gate insulating layer 220 may include hafnium oxide (HfO) or titanium oxide (TiO). The gate insulating layer 220 may have a multi-layer structure.

The gate electrode 230 may be disposed on the gate insulating layer 220. The gate electrode 230 may overlap the channel region of the semiconductor pattern 210. The gate electrode 230 may be insulated from the semiconductor pattern 210 by the gate insulating layer 220. For example, the gate insulating layer 220 may include a side surface vertically aligned with the gate electrode 230. The side surface of the gate insulating layer 220 may be continuous with a side surface of the gate electrode 230.

The gate electrode 230 may include a conductive material. For example, the gate electrode 230 may include a metal, such as aluminum (Al), chrome (Cr), molybdenum (Mo), and/or tungsten (W). The gate electrode 230 may have a multi-layer structure.

The interlayer insulating layer 240 may be disposed on the semiconductor pattern 210 and the gate electrode 230. The interlayer insulating layer 240 may extend beyond the semiconductor pattern 210. The semiconductor pattern 210 and the gate electrode 230 may be covered by the interlayer insulating layer 240.

The interlayer insulating layer 240 may include an insulating material. For example, the interlayer insulating layer 240 may include silicon oxide.

The source electrode 250 may be disposed on the interlayer insulating layer 240. The source electrode 250 may be electrically connected to the source region of the semiconductor pattern 210. For example, the interlayer insulating layer 240 may include a contact hole exposing the source region of the semiconductor pattern 210.

The source electrode 250 may have a multi-layer structure. For example, the source electrode 250 may include a lower source electrode 251, an intermediate source electrode 252, and an upper source electrode 253, which may be sequentially stacked. The lower source electrode 251, the intermediate source electrode 252 and the upper source electrode 253 may include a conductive material. For example, the lower source electrode 251, the intermediate source electrode 252, and the upper source electrode 253 may include a metal, such as aluminum (Al), chrome (Cr), molybdenum (Mo), and/or tungsten (W). The intermediate source electrode 252 may have a conductivity higher than that of the lower source electrode 251 and the upper source electrode 253. The upper source electrode 253 may include a material that is same as that of the lower source electrode 251.

The drain electrode 260 may be disposed on the interlayer insulating layer 240. The drain electrode 260 may be spaced apart from the source electrode 250. The drain electrode 260 may be electrically connected to the drain region of the semiconductor pattern 210. For example, the interlayer insulating layer 240 may include a contact hole exposing the drain region of the semiconductor pattern 210.

The drain electrode 260 may have a multi-layer structure. The structure of the drain electrode 260 may be the same as the structure of the source electrode 250. For example, the drain electrode 260 may include a lower drain electrode 261, an intermediate drain electrode 262, and an upper drain electrode 263, which may be sequentially stacked. The lower drain electrode 261, the intermediate drain electrode 262, and the upper drain electrode 263 may include a conductive material. For example, the lower drain electrode 261, the intermediate drain electrode 262, and the upper drain electrode 263 may include a metal, such as aluminum (Al), chrome (Cr), molybdenum (Mo), and/or tungsten (W). The intermediate drain electrode 262 may have a conductivity higher than that of the lower drain electrode 261 and the upper drain electrode 263. The upper drain electrode 253 may include a material that is the same as that of the lower drain electrode 251.

The upper drain electrode 263 may have a tip region 263$t$ extending to the outside direction from the intermediate drain electrode 262. A side surface 262$s$ of the intermediate drain electrode 262 may be disposed closer to the channel region of the semiconductor pattern 210 than a side surface 263$s$ of the tip region 263$t$ of the upper drain electrode 263. An end portion of the upper drain electrode 263 including the tip region 263$t$ may not overlap the intermediate drain electrode 262. The end portion of the drain electrode 260 may include an under-cut region UC by the intermediate drain electrode 262 and the tip region 263$t$ of the upper drain electrode 263.

The upper drain electrode 263 may have an etch selectivity with respect to the intermediate drain electrode 262. An etch rate of the upper drain electrode 263 may be different from an etch rate of the intermediate drain electrode 262. For example, the upper drain electrode 263 may include a material having a etch rate slower than the intermediate drain electrode 262. The side surface 262$s$ of the intermediate drain electrode 262 may have a positive taper. The side surface 263$s$ of the tip region 263$t$ of the upper drain electrode 263 may have a negative taper.

An etch rate of the lower drain electrode 261 may be slower than the etch rate of the intermediate drain electrode 262. For example, the etch rate of the lower drain electrode 261 may be the same as the etch rate of the upper drain electrode 263. The lower drain electrode 261 may include a portion overlapping the tip region 263$t$ of the upper drain electrode 263. A side surface 261$s$ of the lower drain electrode 261 may be disposed outside the intermediate drain electrode 262. For example, the side surface 261$s$ of the lower drain electrode 261 may have a positive taper.

The thin film transistor 200 may include the interlayer insulating layer 240 between the gate electrode 230 and the source/drain electrodes 250, 260. In another example, the thin film transistor 200 may include a gate insulating layer 220 and a semiconductor pattern 210 between the gate electrode 230 and the source/drain electrodes 250, 260.

The lower passivation layer 120 may be disposed on the thin film transistor 200. The lower passivation layer 120 may extend beyond the source electrode 250 and the drain electrode 260. For example, the lower passivation layer 120 may directly contact the interlayer insulating layer 240 on the outside of the source/drain electrodes 250, 260 of the thin film transistor 200.

The lower passivation layer 120 may include an insulating material. For example, the lower passivation layer 120 may include silicon oxide and/or silicon nitride. The lower passivation layer 120 may have a multi-layer structure.

The lower passivation layer 120 may be partially cut-off by the tip region 263$t$ of the drain electrode 260. For example, a portion of the lower passivation layer 120 overlapping the under-cut region UC of the drain electrode 260 may be spaced apart from a portion of the lower passivation layer 120 disposed at the outside of the end portion of the drain electrode 260 including the tip region 263$t$. The side surface 261$s$ of the lower drain electrode 261 and the side surface 262$s$ of the intermediate drain electrode 262 may be exposed by the lower passivation layer 120.

The lower over-coat layer 130 may be disposed on the lower passivation layer 120. The lower over-coat layer 130 may remove the thickness difference due to the thin film transistor 200. For example, an upper surface of the lower over-coat layer 130 may be parallel with a surface of the lower substrate 100.

The lower over-coat layer 130 may include an insulating material. For example, the lower over-coat layer 130 may include an organic insulating material. The lower over-coat layer 130 may include a curable material. For example, the lower over-coat layer 130 may include a thermosetting resin.

The lower over-coat layer 130 may include a lower contact hole 130$h$ overlapping the side surface 263$s$ of the tip region 263$t$ of the upper drain electrode 263. The side surface 263$s$ of the tip region 263$t$ of the upper drain electrode 263 may be disposed closer to the inside of the lower contact hole 130$h$ than the side surface 262$s$ of the intermediate drain electrode 262. The lower contact hole 130$h$ may be connected to the under-cut region UC of the drain electrode 260. For example, the lower contact hole 130$h$ may expose a portion of the side surface 261$s$ of the lower drain electrode 261 and a portion of the side surface 262$s$ of the intermediate drain electrode 262, which may not be covered by the lower passivation layer 120.

The connection electrode 310 may be disposed on the lower over-coat layer 130. The connection electrode 310 may extend to the inside of the lower contact hole 130$h$. The connection electrode 310 may be connected to the thin film transistor 200 through the lower contact hole 130$h$. For example, the connection electrode 310 may directly contact a portion of the side surface 261$s$ of the lower drain electrode 261 and a portion of the side surface 262$s$ of the intermediate drain electrode 262 exposed by the lower passivation layer 120 and the lower contact hole 130$h$.

The connection electrode 310 may include a conductive material. For example, the connection electrode 310 may include a metal, such as copper (Cu), molybdenum (Mo), titanium (Ti), aluminum (Al), and/or tungsten (W). The connection electrode 310 may have a multi-layer structure. For example, the connection electrode 310 may include a lower connection electrode 311 and an upper connection electrode 312 disposed on the lower connection electrode 311.

The lower passivation layer 120 on the thin film transistor 200 may partially expose the side surface 261s, 262s, and 263s of the drain electrode 260 of the thin film transistor 200 by the under-cur region UC of the drain electrode 260. Thus, a contact hole penetrating the lower passivation layer 120 may not include the drain electrode 260 of the thin film transistor 200 and the connection electrode 310, which may be insulated by the lower passivation layer 120 and the lower over-coat layer 130. That is, the lower contact hole 130h, penetrating the lower over-coat layer 130 for connecting the connection electrode 310 to the drain electrode 260, may be formed without consideration of a process margin for alignment of contact holes. Thereby, a size of the lower contact hole 130h for connecting the drain electrode 260 and the connection electrode 310, which may be disposed on different layers, may be reduced.

The upper over-coat layer 140 may be disposed on the lower over-coat layer 130 and the connection electrode 310. The connection electrode 310 may be disposed between the lower over-coat layer 130 and the upper over-coat layer 140. The upper over-coat layer 140 may remove the thickness difference due to the connection electrode 310. For example, an upper surface of the upper over-coat layer 140 may be parallel with the surface of the lower substrate 100.

The upper over-coat layer 140 may include an insulating material. For example, the upper over-coat layer 140 may include an organic insulating material. The upper over-coat layer 140 may include a curable material. The upper over-coat layer 140 may include a material different from the lower over-coat layer 130.

The upper over-coat layer 140 may include an upper contact hole 141h overlapping the connection electrode 310. For example, the upper contact hole 141h of the upper over-coat layer 140 may be disposed on an upper surface of the connection electrode 310.

A display device according to an example embodiment of the present disclosure may further include a connection clad layer 410 between the connection electrode 310 and the upper over-coat layer 140. The connection clad layer 410 may reduce or prevent the connection electrode 310 from being damaged by a subsequent process. For example, the connection electrode 310 may be covered by the connection clad layer 410.

The connection clad layer 410 may include a conductive material. The connection clad layer 410 may include a material having lower reactivity. For example, the connection clad layer 410 may include a transparent conductive material, such as indium tin oxide (ITO) and/or indium zinc oxide (IZO).

The light-emitting structure 500 may realize a particular color. For example, the light-emitting structure 500 may include a lower emitting electrode 510, an organic light-emitting layer 520, and an upper emitting electrode 530, which may be sequentially stacked. For example, a display device according to an example embodiment of the present disclosure may be an organic light-emitting display device including the organic light-emitting layer 520.

The light-emitting structure 500 may be controlled by the thin film transistor 200. For example, the lower emitting electrode 510 of the light-emitting structure 500 may be electrically connected to the drain electrode 260 of the thin film transistor 200. The light-emitting structure 500 may be disposed on the upper over-coat layer 140. The lower emitting electrode 510 may extend to the inside of the upper contact hole 141h of the upper over-coat layer 140. The lower emitting electrode 510 may be connected to the drain electrode 260 through the upper contact hole 141h and the connection electrode 310.

The lower emitting electrode 310 may include a conductive material. The lower emitting electrode 310 may include a material having high-reflectivity. For example, the lower emitting electrode 310 may include a metal, such as aluminum (Al) and silver (Ag). The lower emitting electrode 310 may have a multi-layer structure. For example, the lower emitting electrode 510 may have a structure in which the reflective electrode including a material having high-reflectivity may be disposed between transparent electrodes including a transparent conductive material, such as ITO and/or IZO.

The organic light-emitting layer 520 may generate light having luminance corresponding to a voltage difference between the lower emitting electrode 510 and the upper emitting electrode 530. For example, the organic light-emitting layer 520 may include an emitting material layer (EML) having an organic emission material. The organic light-emitting layer 520 may have a multi-layer structure, e.g., to increase luminous efficacy. For example, the organic light-emitting layer 520 may further include at least one of a hole injection layer (HIL), a hole transport layer (HTL), an electron transport layer (ETL), and an electron injection layer (EIL).

A display device according to an example embodiment of the present disclosure may be described in that the light-emitting structure 500 may include the organic light-emitting layer 520 having the organic emission material. In another example, the light-emitting structure 500 may include a light-emitting layer having an inorganic emission material or a hybrid emission material.

The upper emitting electrode 530 may include a conductive material. The upper emitting electrode 530 may include a material different from the lower emitting electrode 510. For example, the upper emitting electrode 530 may be a transparent electrode. Thus, in a display device according to an example embodiment of the present disclosure, the light generated by the organic light-emitting layer 520 may be emitted through the upper emitting electrode 530.

A display device according to an example embodiment of the present disclosure may further comprise a bank insulating layer 150 for insulating the light-emitting structures 500 of adjacent pixel areas. For example, the bank insulating layer 150 may cover an edge of the lower emitting electrode 510 of each light-emitting structure 500. The organic light-emitting layer 520 and the upper emitting electrode 530 may be stacked on a surface of a portion of the lower emitting electrode 510, which may be exposed by the bank insulating layer 150. The bank insulating layer 150 may include an insulating material. For example, the bank insulating layer 150 may include an organic insulating material, such as benzo cyclo-butene (BCB), polyimide (PI), and/or photo-acryl. The lower over-coat layer 130 and the upper over-coat layer 140 may include a material different from that of the bank insulating layer 150.

A display device according to an example embodiment of the present disclosure may further comprise an auxiliary electrode 320 for reducing or preventing a luminance unevenness due to the voltage drop of the upper emitting electrode 530. For example, the auxiliary electrode 320 may be disposed between the lower over-coat layer 130 and the upper over-coat layer 140. The upper over-coat layer 140 may further include a penetrating hole 142h overlapping the auxiliary electrode 320. The auxiliary electrode 320 may be spaced apart from the connection electrode 310.

The auxiliary electrode 320 may include a conductive material. For example, the auxiliary electrode 520 may include a metal, such as copper (Cu), molybdenum (Mo), titanium (Ti), aluminum (Al), and/or tungsten (W). The structure of the auxiliary electrode 320 may be the same as the structure of the connection electrode 310. For example, the auxiliary electrode 320 may include a lower auxiliary electrode 321 and an upper auxiliary electrode 322 disposed on the lower auxiliary electrode 321.

A display device according to an example embodiment of the present disclosure may further comprise an auxiliary clad layer 420 between the auxiliary electrode 320 and the upper over-coat layer 140. The auxiliary clad layer 420 may cover the auxiliary electrode 320. The auxiliary clad layer 420 may include a conductive material. For example, the auxiliary clad layer 420 may include a material that is the same as the connection clad layer 410. The auxiliary clad layer 420 may include a transparent conductive material, such as ITO and/or IZO.

The organic light-emitting layer 520 and the upper emitting layer 530 extend onto the bank insulating layer 150. A display device according to an example embodiment of the present disclosure may further comprise a partition 600 for providing a space in which the upper emitting electrode 530 may be electrically connected to the auxiliary electrode 320. For example, a portion of the organic light-emitting layer 520 may be separated from another portion of the organic light-emitting layer 520 by the partition 600. The upper emitting electrode 530 may be electrically connected to the auxiliary electrode 320 through a space between the portions of the organic light-emitting layer 520 separated by the partition 600. A vertical distance of the partition 600 may be larger than a vertical distance of the bank insulating layer 150. For example, the partition 600 may include a lower partition 610 and an upper partition 620 disposed on the lower partition 610. The lower partition 610 and the upper partition 620 may include an insulating material. For example, the lower partition 610 may include a material that is the same as that of the bank insulating layer 150. The upper partition 620 may include a material different from the lower partition 610. For example, the upper partition 620 may include silicon oxide and/or silicon nitride.

A display device according to an example embodiment of the present disclosure may further comprise an intermediate electrode 550 between the auxiliary electrode 320 and the bank insulating layer 150. For example, the intermediate electrode 550 may be connected to the auxiliary electrode 320 through the penetrating hole 142h of the upper over-coat layer 140. The partition 600 may overlap the intermediate electrode 550. For example, the organic light-emitting layer 520 may expose a portion of the intermediate electrode 550 by the partition 600. The bank insulating layer 150 may cover an edge of the intermediate electrode 550. The partition 600 may be disposed between the bank insulating layer 150. The upper emitting electrode 530 may be in contact with the portion of the intermediate electrode 550 in which the organic light-emitting layer 520 may not be formed due to the partition 600. The upper emitting electrode 530 may be electrically connected to the auxiliary electrode 320 through the intermediate electrode 550. The intermediate electrode 550 may include a conductive material. For example, the intermediate electrode 550 may include a material that is the same as that of the lower emitting electrode 510. The intermediate electrode 550 may have a multi-layer structure. For example, the structure of the intermediate electrode 550 may be the same as the structure of the lower emitting electrode 510.

A display device according to an example embodiment of the present disclosure may further comprise an upper substrate 700 opposite to the lower substrate 100. For example, the upper substrate 700 may be disposed on the light-emitting structure 500. The upper substrate 700 may include an insulating material. The upper substrate 700 may include a transparent material. For example, the upper substrate 700 may include glass or plastic.

In a display device according to an example embodiment of the present disclosure, the light-emitting structure 500 of each pixel area may realize a same color. For example, the light-emitting structure 500 of each pixel area may include a white organic light-emitting layer 520. A display device according to an example embodiment of the present disclosure may further comprise a black matrix 710 and a color filter 720 on the upper substrate 700. Thus, in a display device according to an example embodiment of the present disclosure, each pixel area on which the light-emitting structure 500 realizing the same color is disposed may display different colors.

A display device according to an example embodiment of the present disclosure may further comprise a filler 800 filling a space between the lower substrate 100 and the upper substrate 700. The filler 800 may reduce or prevent the light-emitting structure 500 from damage due to an external impact. For example, the filler 800 may extend between the light-emitting structure 500 and the black matrix 710 and between the light-emitting structure 500 and the color filter 720.

A display device according to an example embodiment of the present disclosure may be described in that the light-emitting structure 500 may directly contact the filler 800. In another example, a display device according to another example embodiment of the present invention may further comprise an upper passivation layer between the light-emitting structure 500 and the filler 800. The upper passivation layer may reduce or prevent the external moisture from permeating into the light-emitting structure 500. The upper passivation layer may have a multi-layer structure. For example, the upper passivation layer may have a structure in which an inorganic layer including an inorganic material and an organic layer including an organic material may be stacked.

Accordingly, in a display device according to an example embodiment of the present disclosure, the lower passivation layer 120, disposed closest to the drain electrode 260 among the insulating layers between the drain electrode 260 and the connection electrode 310, may not include a contact hole so that an area of the lower contact hole 130h penetrating the lower over-coat layer 130, which may be disposed between the lower passivation layer 120 and the connection electrode 310, may be reduced. Thus, in a display device according to an example embodiment of the present disclosure, the pixel density, e.g., pixels per inch, may be increased. For example, when a display device according to an example embodiment of the present disclosure is a transparent display device including pixel areas having a light-emitting region and a transparent region, an area of the light-emitting region of each pixel area may be decreased and an area of the transparent region of each pixel area may be increased, so that the overall transparency may be improved.

A display device according to an example embodiment of the present disclosure may be described in that the drain electrode 260 of the thin film transistor 200 may have a three-layer structure. In another example, the drain electrode 260 of the thin film transistor 200 may have various structures. For example, in the display device according to another embodiment of the present invention, the drain electrode 260 of the thin film transistor 200 may include a first drain electrode 264 and a second drain electrode 265 on the first drain electrode 264, as shown in the example of FIG. 3. The second drain electrode 265 may include a region extending to the outside of the first drain electrode 264. Thus, in a display device according to an example embodiment of the present disclosure, the area of the contact hole may be efficiently reduced.

A display device according to an example embodiment of the present disclosure is described that the thin film transistor 200 may be electrically connected to the lower emitting electrode 510 of the light-emitting structure 500 by the connection electrode 310. In another example, the lower emitting electrode 510 of the light-emitting structure 500 may be electrically connected to the thin film transistor 200 by various methods. For example, the lower emitting electrode 510 of the light-emitting structure 500 may directly contact the thin film transistor 200 by the lower contact hole 130h of the lower over-coat layer 130, as shown in the FIG. 4 example. Thus, the pixel density, e.g., pixels per inch, may be efficiently improved.

FIGS. 5A to 5J are views sequentially showing operations of a method of manufacturing a display device according to an example embodiment of the present disclosure.

A method of manufacturing a display device according to an example embodiment of the present disclosure will be described with reference to FIGS. 1, 2A, and 5A to 5J. First, as shown in the FIG. 5A example, the method of manufacturing a display device according to an example embodiment of the present disclosure may include an operation of forming (or "providing") a semiconductor pattern 210 on a lower substrate 100, an operation of forming a gate insulating layer 220 and a gate electrode 230 on the semiconductor pattern 210, an operation of forming an interlayer insulating layer 240 on the semiconductor pattern 210 and the gate electrode 230, an operation of forming contact holes exposing a portion of the semiconductor pattern 210 in the interlayer insulating layer 240, an operation of forming a first conductive material layer 201 connected to the semiconductor pattern 210 through the contact holes on the interlayer insulating layer 240, an operation of forming a second conductive material layer 202 on the first conductive material layer 201, and an operation of forming a third conductive material layer 203 on the second conductive material layer 202.

The third conductive material layer 203 may include a conductive material having an etch selectivity with respect to the second conductive material layer 202. For example, the third conductive material layer 203 may be formed of a material having an etch rate slower than that of the second conductive material layer 202. For example, the first conductive material layer 201 may be formed of a material having an etch rate slower than the second conductive material layer 202. The first conductive material layer 201 may be formed of a material that is the same as the material of the third conductive material layer 203.

Figure 5A:
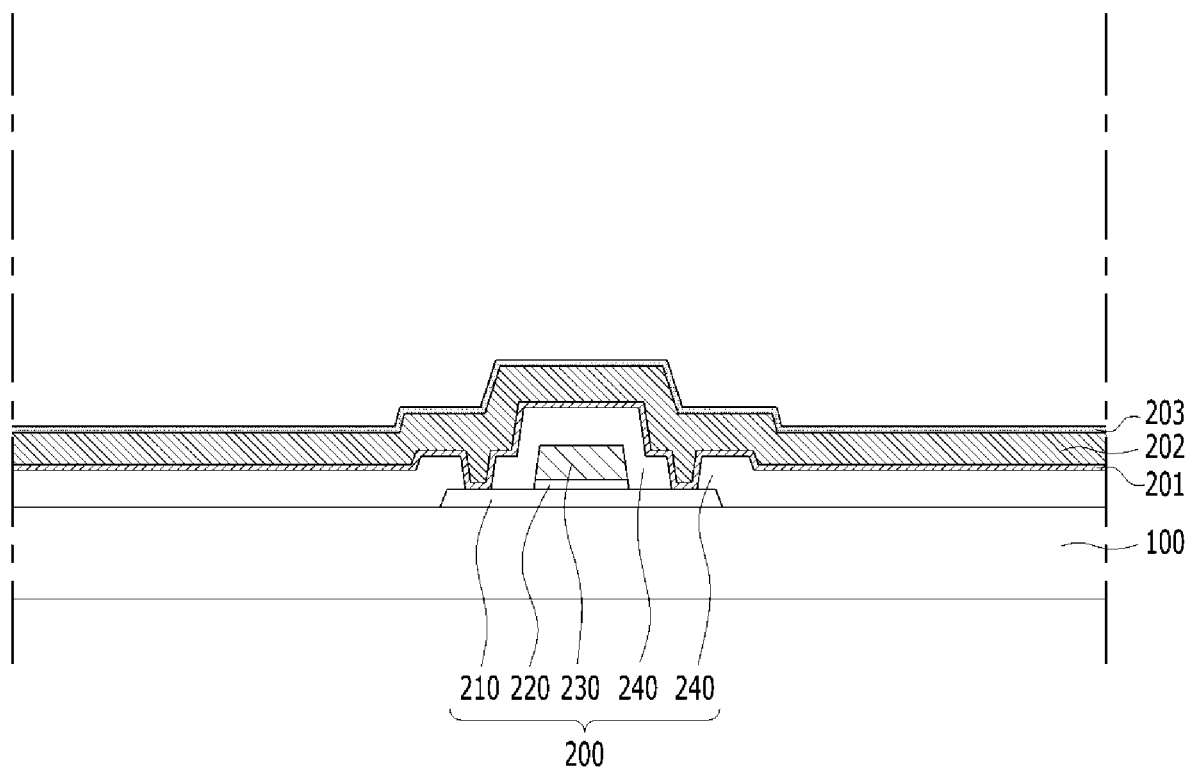
FIGS. 5A to 5J are views sequentially showing operations of a method of manufacturing a display device according to an example embodiment of the present disclosure.
Figure 5B:
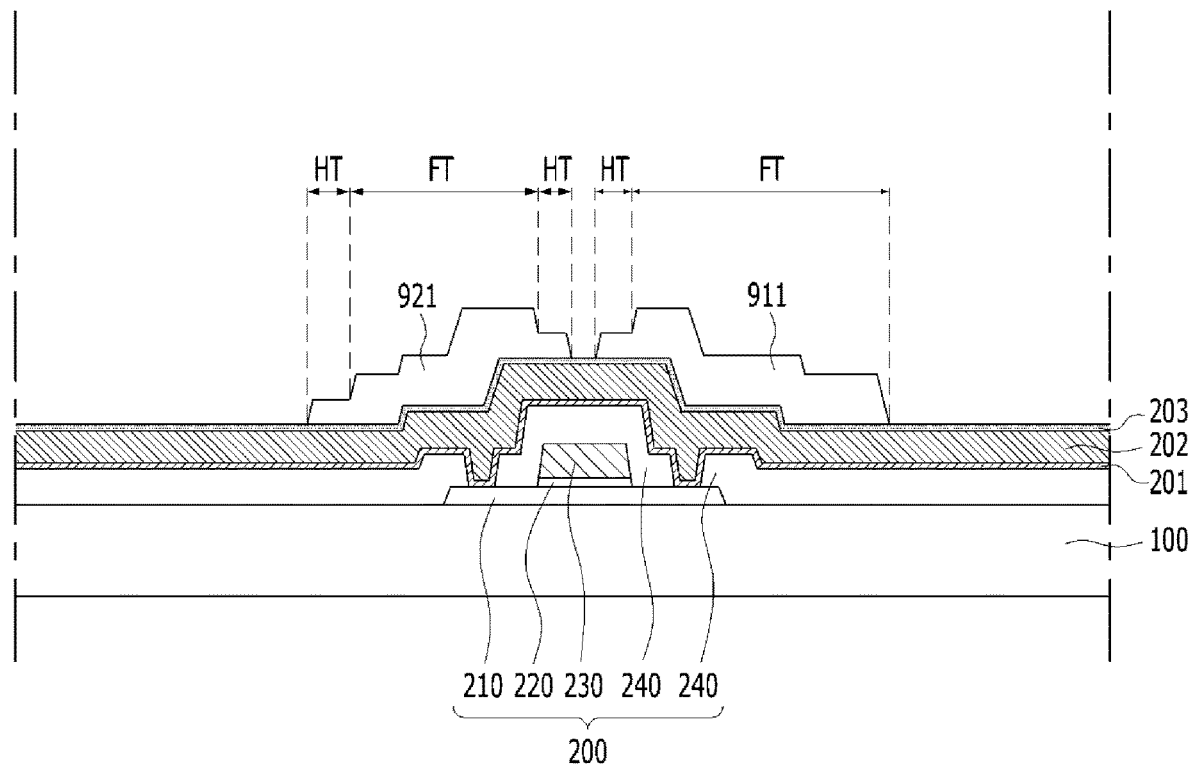

As shown in the FIG. 5B example, the method may further include an operation of forming a mask pattern 911 and 921, including a half-tone region HT and a full-tone region FT thicker than the half-tone region HT on the third conductive material layer 203. The mask pattern 911 and 921 may include a first mask pattern 911 overlapping the contact hole exposing a portion of the semiconductor pattern 210, and a second mask pattern 921 overlapping the contact hole exposing another portion of the semiconductor pattern 210. For example, the portion of the semiconductor pattern 210 covered by the first mask pattern 911 may be a drain region of the semiconductor patter 210. For example, the portion of the semiconductor pattern 210 covered by the second mask pattern 921 may be a source region of the semiconductor pattern 210. The gate electrode 230 may be disposed between the first mask pattern 911 and the second mask pattern 921. The portion of the semiconductor pattern 210 overlapping the gate electrode 230 may be a channel region.

The half-tone region HT of the first mask pattern 911 may be disposed on an end portion toward the second mask pattern 921. The half-tone region HT of the second mask pattern 921 may be disposed on an end portion toward the first mask pattern 911 and another end portion opposite the end portion. An end portion of the first mask pattern 911 opposite the second mask pattern 921 may be a full-tone region FT of the first mask pattern 911.

The operation of forming the mask pattern 911 and 921 may be formed using the half-tone mask. For example, the half-tone region HT of the mask pattern 911 and 921 may be a region partially exposed by the half-tone mask.

Figure 5C:
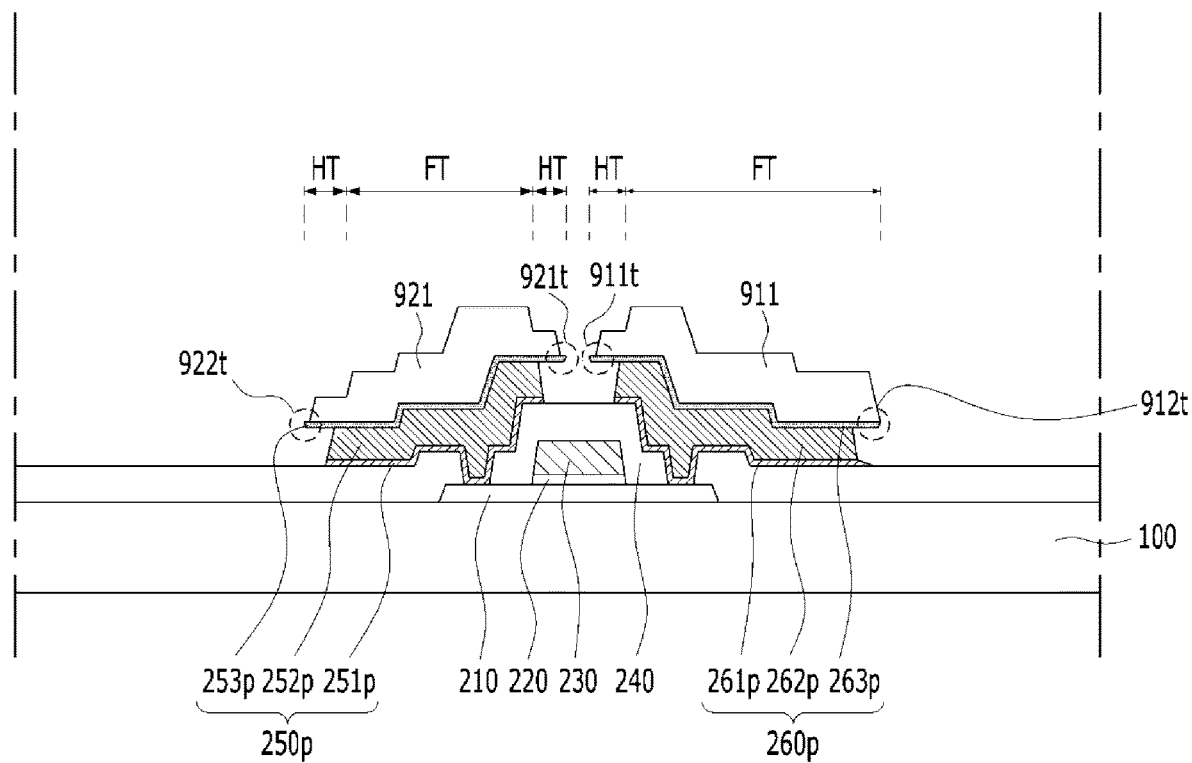

As shown in the FIG. 5C example, the method may further include an operation of forming a preliminary source electrode 250p and a preliminary drain electrode 260p on the interlayer insulating layer 240. The operation of forming the preliminary source electrode 250p and the preliminary drain electrode 260p may include an operation of sequentially etching the third conductive material layer 203, the second conductive material layer 202, and the first conductive material layer 201 using the mask pattern 911 and 921. For example, the preliminary source electrode 250p may include a lower preliminary source electrode 251p, an intermediate preliminary source electrode 252p, and an upper preliminary source electrode 253p. For example, the preliminary drain electrode 260p may include a lower preliminary drain electrode 261p, an intermediate preliminary drain electrode 262p, and an upper preliminary drain electrode 263p.

Because the second conductive material layer 202 may have an etch rate faster than the third conductive material layer 203, a side surface of the intermediate preliminary source electrode 252p and a side surface of the intermediate preliminary drain electrode 262p may be disposed relatively inward. For example, the upper preliminary drain electrode 263p may include a first preliminary drain tip region 911t and a second preliminary drain tip region 912t, which may be extended to the outside of the intermediate preliminary drain electrode 262p. The first preliminary drain tip region 911t of the upper preliminary drain electrode 263p may extend toward the upper preliminary source electrode 253p. The second preliminary drain tip region 912t of the upper preliminary drain electrode 263p may be opposite the first preliminary drain tip region 911t of the upper preliminary drain electrode 263p. For example, the upper preliminary source electrode 253p may include a first preliminary source tip region 921t and a second preliminary source tip region 922t, which may extend to the outside of the intermediate preliminary source electrode 252p. The first preliminary source tip region 921t of the upper preliminary source electrode 253p may extend toward the upper preliminary drain electrode 263p. The second preliminary source tip region 922t of the upper preliminary source electrode 253p may be opposite the first preliminary source tip region 921t of the upper preliminary source electrode 253p. The lower preliminary source electrode 251p and the lower preliminary drain electrode 261p may each respectively include a region disposed outside the intermediate preliminary source electrode 252p and the intermediate preliminary drain electrode 262p.

A side surface of the lower preliminary source electrode 251p, a side surface of the intermediate preliminary source electrode 252p, a side surface of the lower preliminary drain electrode 261p, and a side surface of the intermediate preliminary drain electrode 262p may each have a positive taper. Each of the upper preliminary source electrode 253p and the upper preliminary drain electrode 263p may have a bottom surface that may be etched faster than a top surface. A side surface of the first preliminary source tip region 921t and a side surface of the second preliminary source tip region 922t may each have a negative taper. A side surface of the first preliminary drain tip region 911t and a side surface of the second preliminary drain tip region 912t may each have a negative taper.

Figure 5D:
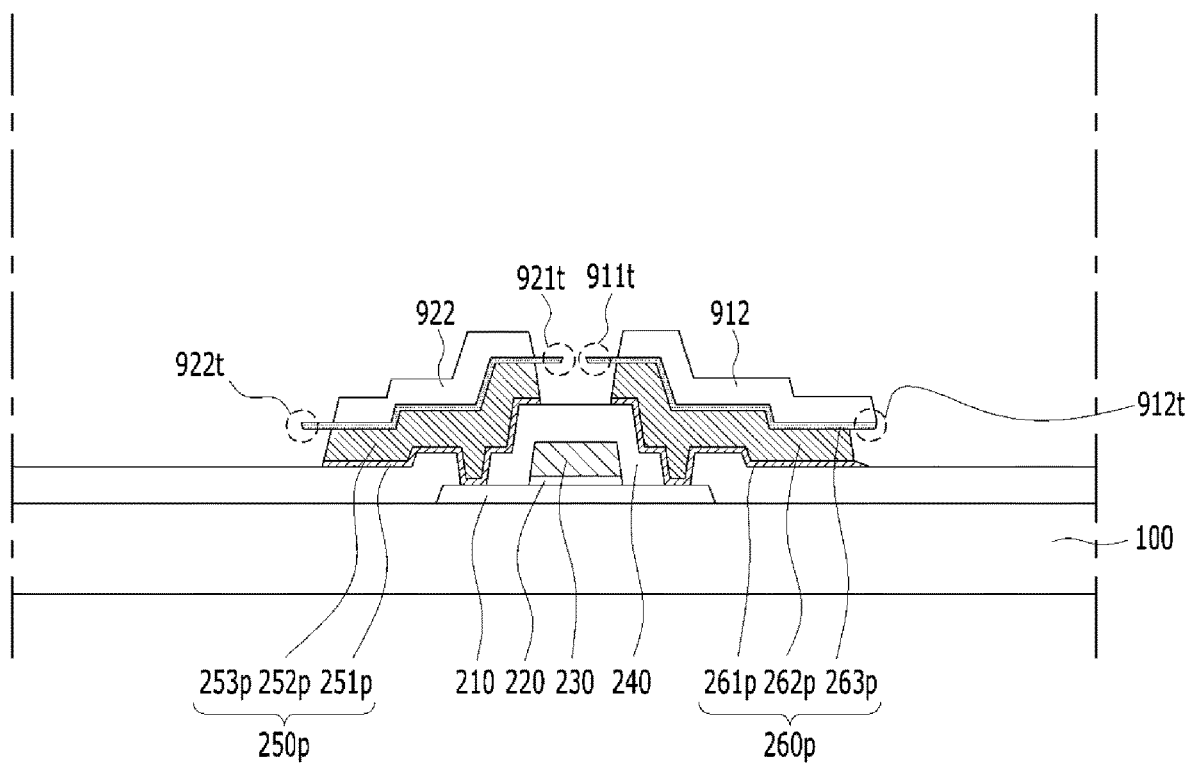

As shown in the FIG. 5D example, the method may further include an operation of forming a third mask pattern 912 on the preliminary drain electrode 260p, and forming a fourth mask pattern 922 on the preliminary source electrode 250p. The operation of forming the third mask pattern 921 and the fourth mask pattern 922 may include an operation of removing the half-tone region HT of the first mask pattern 911 and the half-tone region HT of the second mask pattern 921. For example, the operation of forming the third mask pattern 921 and the fourth mask pattern 922 may include an operation of ashing the mask pattern 911 and 921.

The third mask pattern 921 may expose the first preliminary drain tip region 911t of the upper preliminary drain electrode 263p. The third mask pattern 921 may cover the second preliminary drain tip region 912t of the upper preliminary drain electrode 263p. The second preliminary drain tip region 912t of the upper preliminary drain electrode 263p may be hidden by the third mask pattern 921. The fourth mask pattern 922 may expose the first preliminary source tip region 921t and the second preliminary source tip region 922t of the upper preliminary source electrode 253p.

Figure 5E:
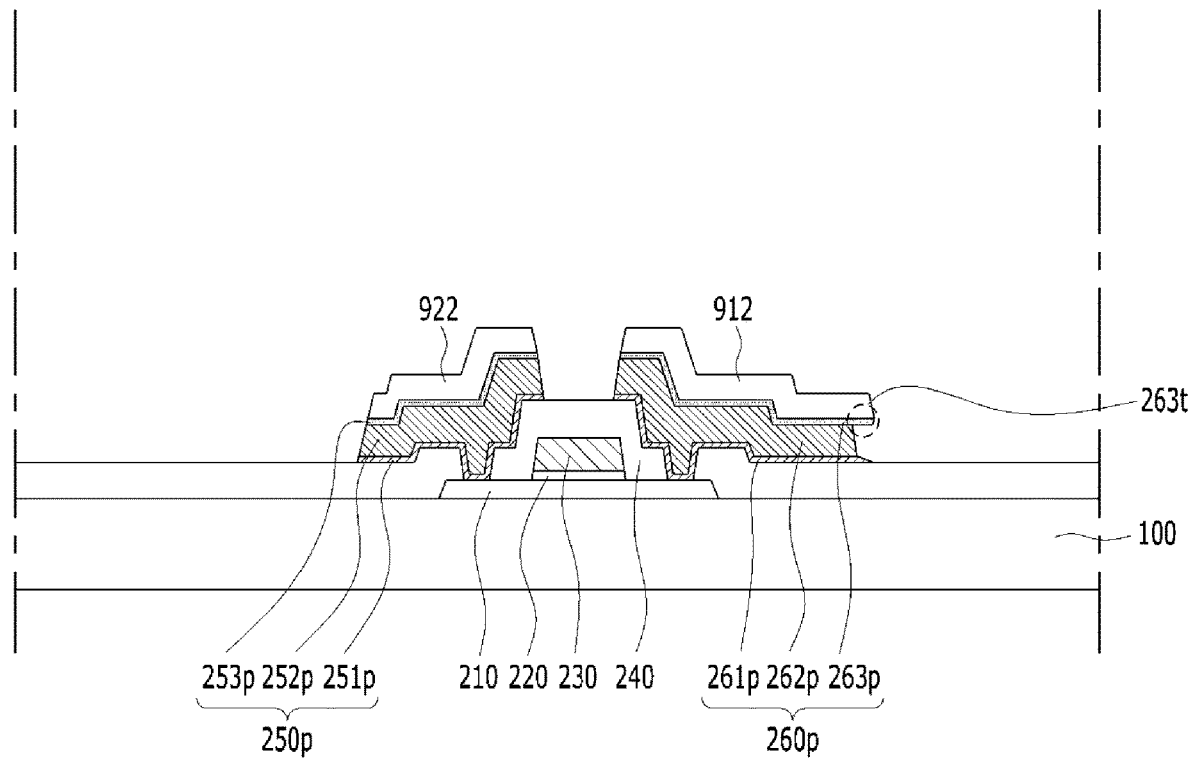

As shown in the FIG. 5E example, the method may further include an operation of forming a source electrode 250 and a drain electrode 260 on the interlayer insulating layer 240 so that a thin film transistor 200 may be completely formed. The operation of forming the source electrode 250 and the drain electrode 260 may include an operation of removing the tip regions 911t, 921t, and 922t exposed by the third mask pattern 912 and the fourth mask pattern 922. The source electrode 250 may include a lower source electrode 251, an intermediate source electrode 252, and an upper source electrode 253, which may be sequentially stacked. The source electrode 250 may be connected to the source region of the semiconductor pattern 210. The drain electrode 260 may include a lower drain electrode 261, an intermediate drain electrode 262, and an upper drain electrode 263, which may be sequentially stacked. The drain electrode 260 may be connected to the drain region of the semiconductor pattern 210.

By the operation of removing tip regions 911t, 921t, and 922t exposed by the third mask pattern 912 and the fourth mask pattern 922, a side surface of the upper source electrode 253 and the upper drain electrode 263, in which the tip regions 911t, 921t and 922t were disposed, may be continuous with respective side surfaces of the intermediate source electrode 252 and a side surface of the intermediate drain electrode 262. A side surface of the upper source electrode 253 and a side surface of the upper drain electrode 263 facing each other may each have a positive taper. A side surface of the upper source electrode 253 opposite to the upper drain electrode 263 may have a positive taper.

The second preliminary drain tip region 912t covered by the fourth mask pattern 912 may be not removed. The upper drain electrode 263 of the drain electrode 260 may include a tip region 263t disposed at an end portion opposite to the source electrode 250. A side surface of the tip region 263t of the drain electrode 260 may have a negative taper.

Figure 5F:
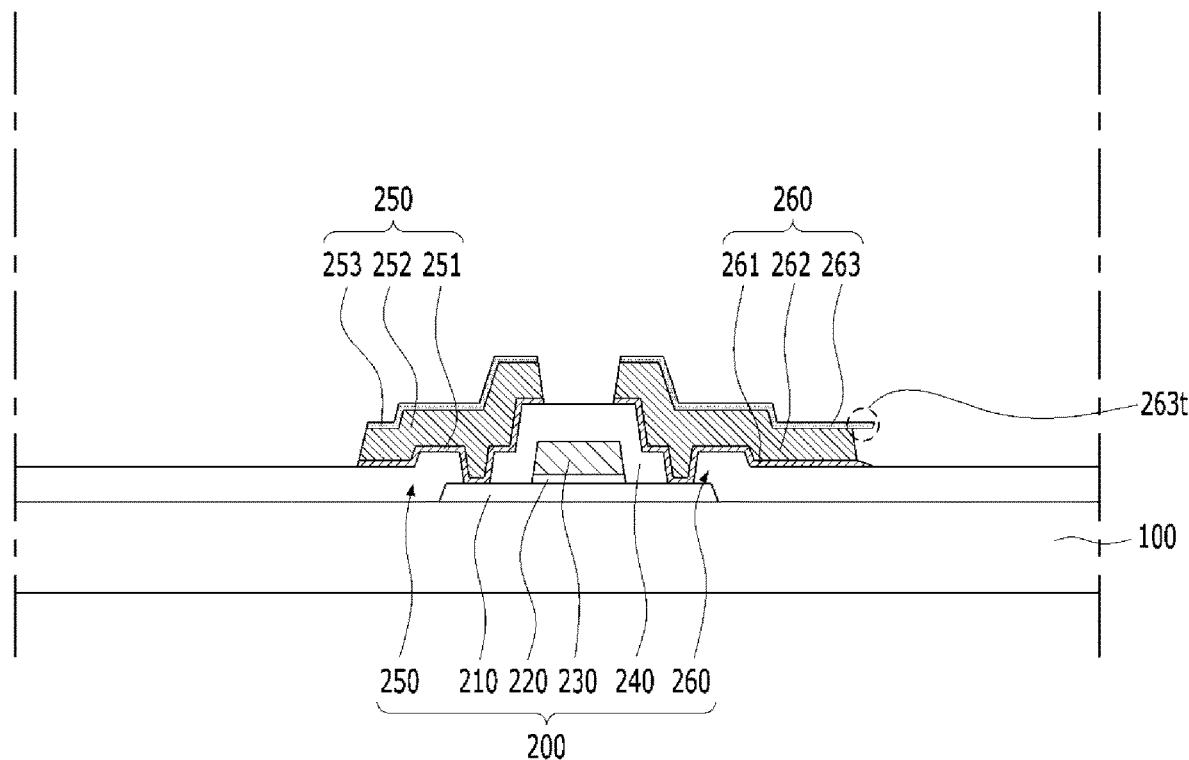
Figure 5G:
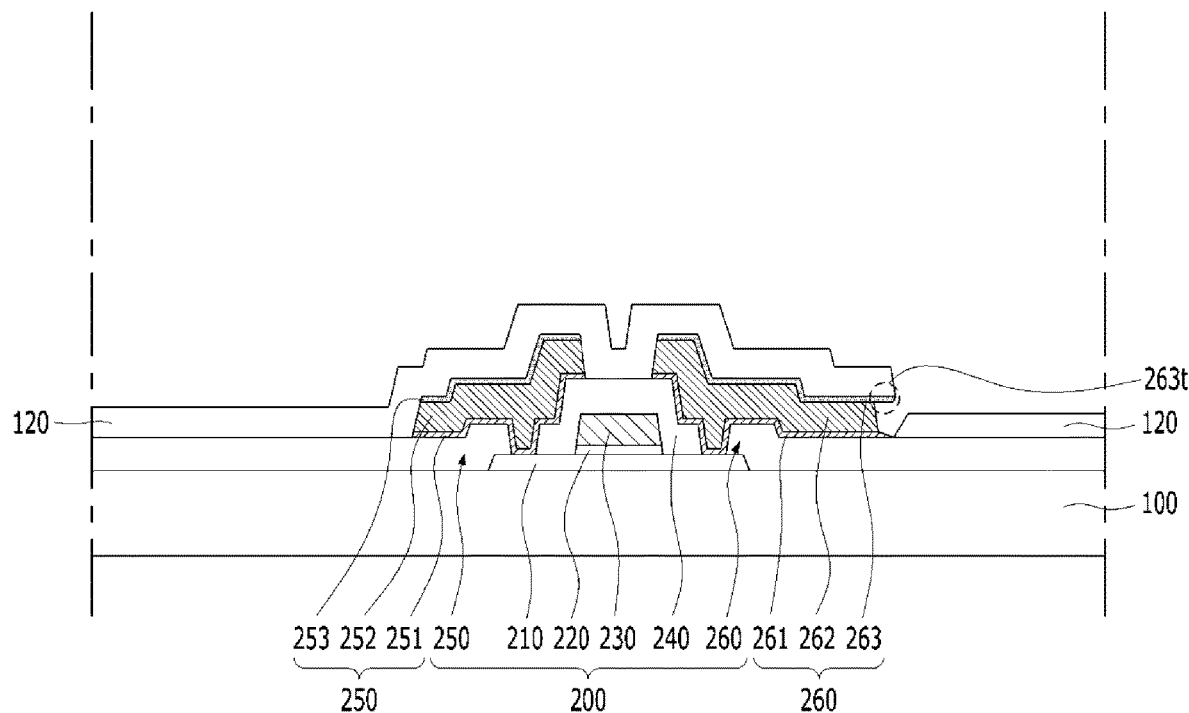

As shown in the FIG. 5F example, the method may further include an operation of removing the third mask pattern 912 and the fourth mask pattern 922. As shown in the FIG. 5G example, the method may further include an operation of forming a lower passivation layer 120 on a lower substrate 100 in which the source electrode 250 and the drain electrode 260 may be formed.

The lower passivation layer 120 may be formed by a process having lower step coverage. For example, the operation of forming the lower passivation layer 120 may include a thermal evaporation process. The lower passivation layer 120 may partially expose a side surface of the drain electrode 260 by the tip region 263t of the drain electrode 260. For example, the lower passivation layer 120 may expose a side surface of the intermediate drain electrode 262 and a side surface of the lower drain electrode 261 that may overlap the tip region 263t of the upper drain electrode 263.

Figure 5H:
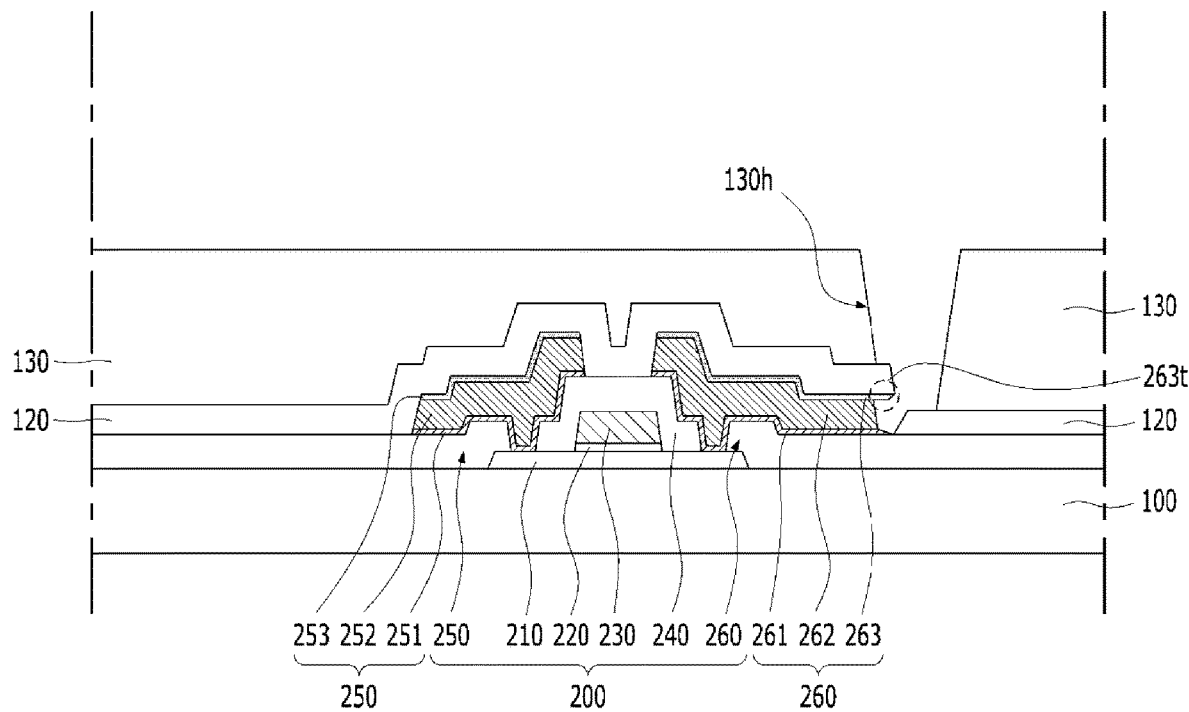

As shown in the FIG. 5H example, the method may further include an operation of forming a lower over-coat layer 130, including a lower contact hole 130h, on the lower passivation layer 120. The operation of forming the lower over-coat layer 130, including the lower contact hole 130h, may include an operation of forming the lower over-coat layer 130 on the lower passivation layer 120, and may include an operation of forming the lower contact hole 130h overlapping the side surface of the tip region 263t of the upper drain electrode 263 in the lower over-coat layer 130. The lower passivation layer 120 and the lower contact hole 130h may expose a side surface of the intermediate drain electrode 262 disposed closer the tip region 263t of the upper drain electrode 263.

Figure 5I:
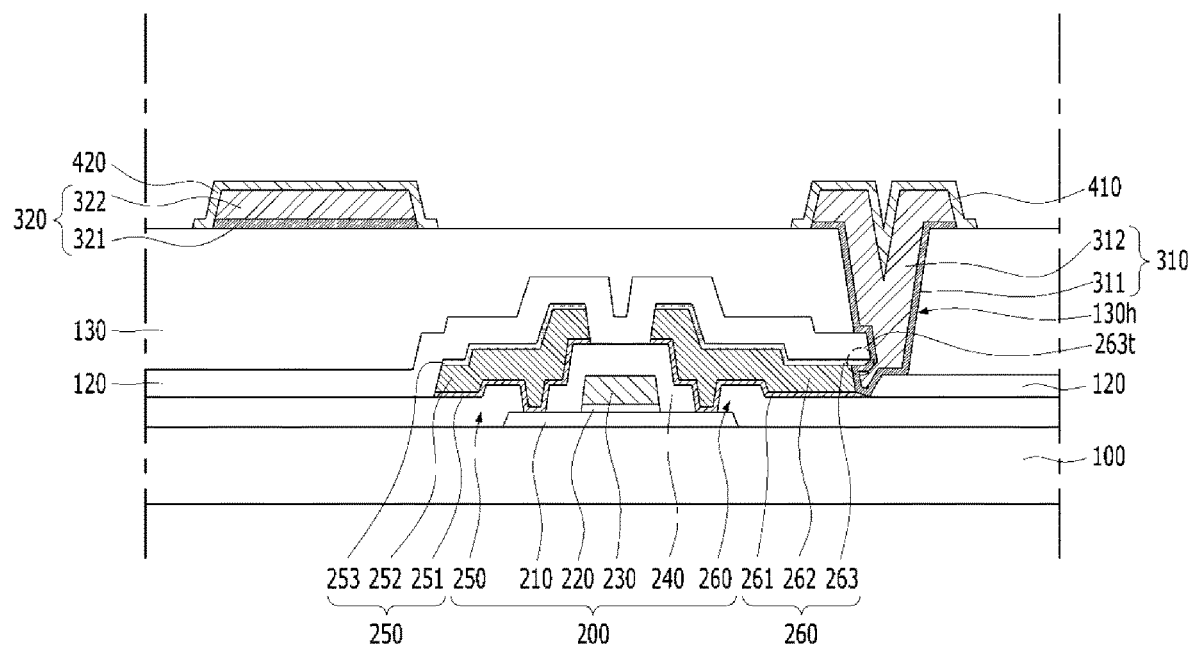

As shown in the FIG. 5I example, the method may further include an operation of forming a connection electrode 310, an auxiliary electrode 320, a connection clad layer 410, and an auxiliary clad layer 420 on the lower over-coat layer 130. The auxiliary electrode 320 may be formed simultaneously (e.g., in a same process) with the connection electrode 310. For example, the operation of forming the connection electrode 310 and the auxiliary electrode 320 may include an operation of sequentially forming a lower conductive material layer and an upper conductive material layer on the lower over-coat layer 130, and an operation of patterning the lower conductive material layer and the upper conductive material layer, which may be stacked. The lower conductive material layer and the upper conductive material layer, which may be stacked, may fill the lower contact hole 130h of the lower over-coat layer 130. The connection electrode 310 may include a portion of the lower conductive material layer and a portion of the upper conductive material layer, which may fill the lower contact hole 130h of the lower over-coat layer 130. The auxiliary electrode 320 may be spaced apart from the connection electrode 310.

The auxiliary clad layer 420 may be formed simultaneously (e.g., in a same process) with the connection clad layer 410. For example, the operation of forming the connection clad layer 410 and the auxiliary clad layer 420 may include an operation of sequentially forming a clad material layer on the connection electrode 310 and the auxiliary electrode 320, and an operation of patterning the clad material layer.

The connection clad layer 410 may cover the connection electrode 310. The auxiliary clad layer 420 may cover the auxiliary electrode 410. The auxiliary clad layer 420 may be spaced apart from the connection clad layer 410.

Figure 5J:
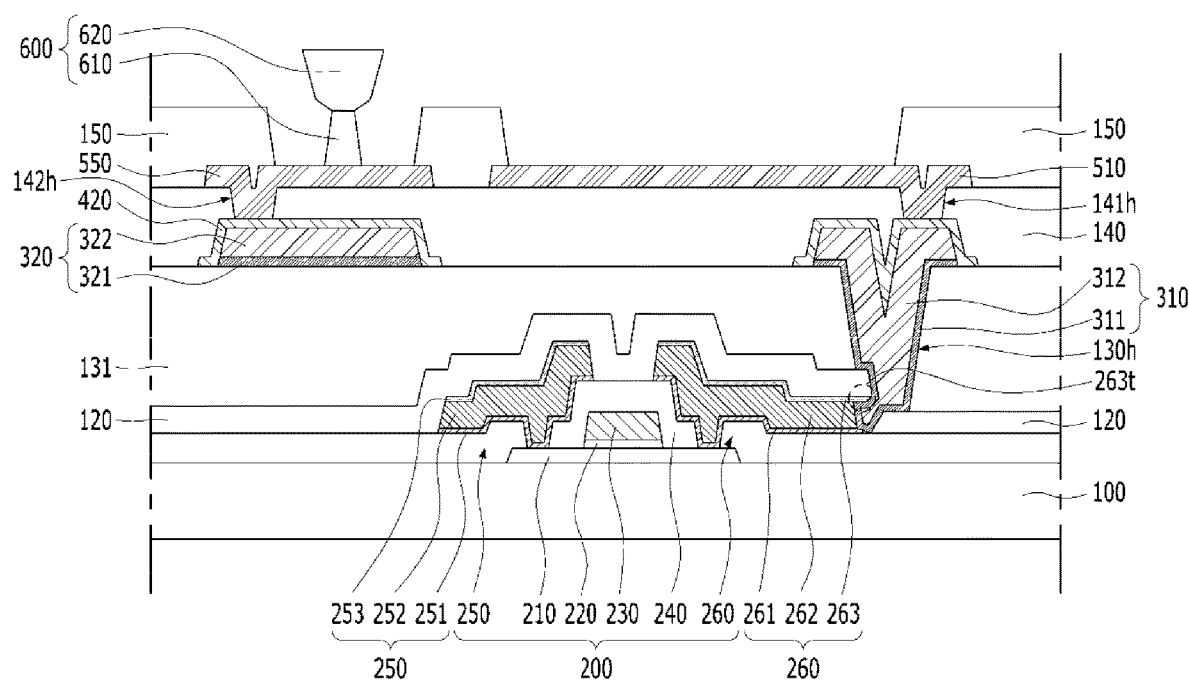

As shown in the FIG. 5J example, the method may further include an operation of forming an upper over-coat layer 140 having an upper contact hole 141h and a penetrating hole 142h on the connection clad layer 410 and the auxiliary clad layer 420, an operation of forming a lower emitting electrode 510 electrically connected to the connection electrode 310 through the upper contact hole 141h and an intermediate electrode 550 electrically connected to the auxiliary electrode 320 through the penetrating hole 142h on the upper over-coat layer 140, an operation of forming a bank insulating layer 150 covering an edge of the lower emitting electrode 510 and an edge of the intermediate electrode 550, and an operation of forming a partition 600 on a surface of the intermediate electrode 550 exposed by the bank insulating layer 150. The operation of forming a partition 600 may include an operation of forming a lower partition 610 partially exposing the surface of the intermediate electrode 550 simultaneously (e.g., in a same process) with the bank insulating layer 150, and an operation of forming an upper partition 620 on the lower partition 610.

As shown in the examples of FIGS. 1 and 2A, the method may include an operation of sequentially forming an organic light-emitting layer 520 and an upper emitting electrode 530 on the lower substrate 100 including the bank insulating layer 150 and the partition 600 so that the light-emitting structure may be completely formed. The organic light-emitting layer 520 may be formed by a process having a lower step coverage. For example, the operation of forming the organic light-emitting layer 520 may include a thermal evaporation process. The organic light-emitting layer 520 may expose a portion of the intermediate electrode 550 by the partition 600.

The upper electrode 530 may be formed by a process having a higher step coverage. For example, the operation of forming the upper electrode 530 may include a sputtering process. The upper electrode 530 may directly contact the portion of the intermediate electrode 550 exposed by the organic light-emitting layer 520.

The method may include an operation of attaching the upper substrate 700 including a black matrix 710 and a color filter 720 to the lower substrate 100 including the light-emitting structure 500. The operation of bonding the lower substrate 100 and the upper substrate 700 may include an operation of filling a filler 800 between the light-emitting structure 500 and the black matrix 710, and between the light-emitting structure 500 and the color filter 720.

In a method of forming a display device according to an example embodiment of the present disclosure, because the side surface of the drain electrode 260 of the thin film transistor 200 may be partially exposed by a process of forming the lower passivation layer 120 on the thin film transistor 200, a process of forming a contact hole in the lower passivation layer 120 may be omitted. Thus, in a method of forming a display device according to an example embodiment of the present disclosure, the side surface of the drain electrode 260, which may not be covered by the lower passivation layer 120, may be exposed through the lower contact hole 130h of the lower over-coat layer 130 disposed on the lower passivation layer 120 so that the forming process of the contact hole electrically connecting the connection electrode 310 to the drain electrode 260 spaced apart by the lower passivation layer 120 and the lower over-coat layer 130 may be simplified. Also, in a method of forming a display device according to an example embodiment of the present disclosure, the lower contact hole 130h of the lower over-coat layer 130 may be formed without considering a process margin for the alignment of the contact holes so that the lower contact hole 130h may be formed to have a relatively small size. Thereby, in a method of forming a display device according to an example embodiment of the present disclosure, the process cost and the process time may be reduced and the pixel density, e.g., pixels per inch (PPI), may be increased.

As a result, a display device according to an example embodiment of the present disclosure may include an operation of forming an under-cut region at an end portion of the electrode disposed relatively lower so that the insulating layer disposed closest to the electrode may be partially cut-off. Thus, in a display device according to an example embodiment, a process of forming a contact hole in the insulating layer disposed closest to the electrode disposed relatively lower among the insulating layers stacked between two electrodes may be omitted. That is, in a display device according to an example embodiment, the area of the contact hole penetrating the stacked insulating layers between the two electrodes may be reduced. Therefore, in a display device according to an example embodiment, the pixel density, e.g., pixels per inch (PPI), may be improved.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A display device, comprising:
    a lower substrate;
    a first over-coat layer on the lower substrate, the first over-coat layer comprising a first contact hole;
    a thin film transistor between the lower substrate and the first over-coat layer, the thin film transistor comprising a drain electrode comprising an end portion overlapping the first contact hole, the end portion of the drain electrode comprising an under-cut region;
    a lower passivation layer between the thin film transistor and the first over-coat layer, the lower passivation layer partially exposing a side surface of the end portion of the drain electrode;
    a light-emitting structure on the first over-coat layer, the light-emitting structure being electrically connected to the thin film transistor through the first contact hole,
    wherein the lower passivation layer comprises:
        a first portion overlapping the under-cut region of the drain electrode, and
        a second portion outside the end portion of the drain electrode, the second portion being spaced apart from the first portion.

2. The display device of claim 1, wherein the drain electrode comprises:
    a first drain electrode; and
    a second drain electrode disposed between the first drain electrode and the lower passivation layer, a side surface of the second drain electrode being closer to a center of the first contact hole than a side surface of the first drain electrode.

3. The display device of claim 2, wherein the lower passivation layer exposes the side surface of the first drain electrode.

4. The display device of claim 2, wherein the second drain electrode comprises etch selectivity with respect to the first drain electrode.

5. The device of claim 4, wherein the second drain electrode comprises a material having a lower etch speed than a material of the first drain electrode.

6. The device of claim 1, further comprising:
- a connection electrode connected between the first over-coat layer and the light-emitting structure, the connection electrode extending to the inside of the first contact hole; and
- a second over-coat layer between the connection electrode and the light-emitting structure, the second over-coat layer comprising a second contact hole overlapping the connection electrode,
- wherein the light-emitting structure is electrically connected to the thin film transistor by the connection electrode and the second contact hole.

7. A method of manufacturing a display device, the method comprising:
- providing a lower substrate;
- providing a first over-coat layer on the lower substrate, the providing the first over-coat layer comprising providing a first contact hole;
- providing a thin film transistor between the lower substrate and the first over-coat layer, the providing the thin film transistor comprising providing a drain electrode comprising an end portion overlapping the first contact hole, the end portion of the drain electrode comprising an under-cut region;
- providing a lower passivation layer between the thin film transistor and the first over-coat layer, the lower passivation layer partially exposing a side surface of the end portion of the drain electrode;
- providing a light-emitting structure on the first over-coat layer, the light-emitting structure being electrically connected to the thin film transistor through the first contact hole,
- wherein the forming the lower passivation layer comprises:
  - providing a first portion overlapping the under-cut region of the drain electrode; and
  - providing a second portion outside the end portion of the drain electrode, the second portion being spaced apart from the first portion.

8. The method of claim 7, wherein the providing the drain electrode comprises:
- providing a first drain electrode; and
- providing a second drain electrode disposed between the first drain electrode and the lower passivation layer, a side surface of the second drain electrode being closer to a center of the first contact hole than a side surface of the first drain electrode.

9. The method of claim 8, wherein the lower passivation layer exposes the side surface of the first drain electrode.

10. The method of claim 8, wherein the second drain electrode comprises etch selectivity with respect to the first drain electrode.

11. The method of claim 10, wherein the providing the second drain electrode comprises providing a material having a lower etch speed than a material of the first drain electrode.

12. The method of claim 7, further comprising:
- providing a connection electrode connected between the first over-coat layer and the light-emitting structure, the connection electrode extending to the inside of the first contact hole; and
- providing a second over-coat layer between the connection electrode and the light-emitting structure, the providing the second over-coat layer comprising providing a second contact hole overlapping the connection electrode,
- wherein the light-emitting structure is electrically connected to the thin film transistor by the connection electrode and the second contact hole.

* * * * *